US006921573B2

(12) United States Patent
Watanabe et al.

(10) Patent No.: US 6,921,573 B2
(45) Date of Patent: Jul. 26, 2005

(54) HIGH-FREQUENCY CURRENT SUPPRESSION BODY USING MAGNETIC LOSS MATERIAL EXHIBITING OUTSTANDING COMPLEX PERMEABILITY CHARACTERISTICS

(75) Inventors: Shinya Watanabe, Tokyo (JP); Koji Kamei, Kawasaki (JP); Yoshio Awakura, Yokohama (JP)

(73) Assignee: NEC TOKIN Corporation, Miyagi (JP)

(*) Notice: Subject to any disclaimer, the term of this patent is extended or adjusted under 35 U.S.C. 154(b) by 252 days.

(21) Appl. No.: 09/836,711

(22) Filed: Apr. 17, 2001

(65) Prior Publication Data

US 2002/0074144 A1 Jun. 20, 2002

(51) Int. Cl.[7] .......................... B23B 33/00; B23B 9/00; B23B 19/00; B27N 9/00; H01F 1/00
(52) U.S. Cl. ..................... 428/343; 428/40.1; 428/692; 428/693; 428/900; 428/928; 204/192.2; 257/645; 257/728
(58) Field of Search ................ 428/900, 928, 428/692, 693, 40.1, 343; 204/192.2; 340/55.1; 427/128, 569, 576; 257/645, 728; 174/35 R, 258

(56) References Cited

U.S. PATENT DOCUMENTS 5,439,754 A * 8/1995 Iwasaki et al. ............. 428/692
5,561,265 A * 10/1996 Livshits et al. .......... 174/35 GC
5,827,445 A * 10/1998 Yoshida et al. ........... 252/62.54

2001/0026016 A1 * 10/2001 Yoshida et al.
2002/0129875 A1 * 9/2002 Ikeda et al.

FOREIGN PATENT DOCUMENTS

| DE | 363 1 696 A1 | 4/1988 |
| EP | 0 831 685 A2 | 3/1998 |
| EP | 0 877 394 A1 | 11/1998 |
| EP | 0877394 | * 11/1998 |
| EP | 0 887 834 A2 | 12/1998 |
| WO | WO 00/19792 | * 4/2000 |

OTHER PUBLICATIONS

S.H. Han, et al.; Soft Magnetic Proeprties of Fe– (Si3N4, A1203) Thin Films, IEEE Transactions on Magnetics, IEEE Inc., Sep. 1996; vol. 32, No.: 5 pp. 4499–4501, New York, European Search Report, Aug. 23, 2001.*
S.H. Han, et al.; Soft Magnetic Properties of Fe–(Si3N4, Al2O3) Thin Films, IEEE Transactions on Magnetics, IEEE Inc., Sep. 1996, Vol. 32, No.: 5, pp. 4499–4501, New York. European Search Report, Aug. 23, 2001.

* cited by examiner

Primary Examiner—Harold Pyon
Assistant Examiner—Patricia L. Nordmeyer
(74) Attorney, Agent, or Firm—Bradley N. Ruben

(57) ABSTRACT

The present invention is a high-frequency current essentially of M—X—Y, where M is Fe, Co, and/or Ni, X is an element other than M or Y, and Y is F, N, and/or O. The maximum value $\mu''_{max}$ of the loss factor $\mu''$ of this material exists at 100 MHz to 10 GHz. A relative bandwidth bwr is not greater than 200% where the relative bandwidth bwr is obtained between two frequencies at which the value of $\mu''$ is 50% of $\mu''_{max}$ and normalizing the frequency bandwidth at the center frequency.

16 Claims, 7 Drawing Sheets

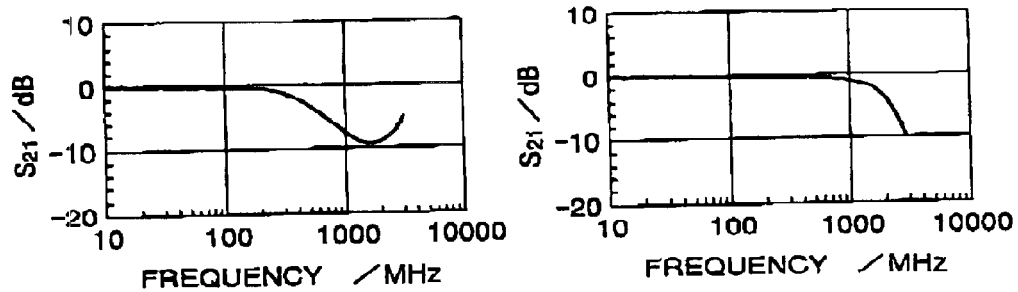
FIG. 12A  FIG. 12B
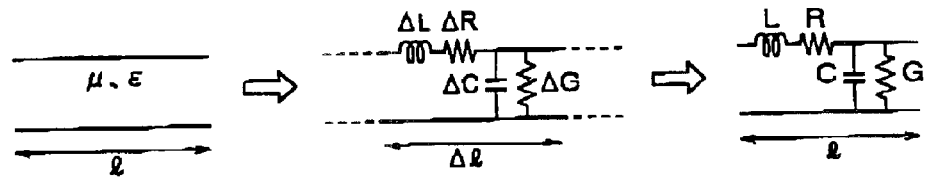
FIG. 13

HIGH-FREQUENCY CURRENT SUPPRESSION BODY USING MAGNETIC LOSS MATERIAL EXHIBITING OUTSTANDING COMPLEX PERMEABILITY CHARACTERISTICS

BACKGROUND OF THE INVENTION (1) Field of the Invention

This invention relates to magnetic bodies having outstanding magnetic loss characteristics at high frequencies, and more particularly to magnetic loss materials exhibiting outstanding complex permeability characteristics effective in suppressing spurious radiation that causes problems in active devices that operate at high speeds, high-frequency electronic components, and electronic equipment, together with a manufacturing method therefor, and a high-frequency current suppression body and suppression method using such magnetic loss materials.

(2) Description of the Related Art

The proliferation of highly integrated semiconductor devices that operate at high speed has been remarkable in recent years. Examples include the random access memory (RAM), read only memory (ROM), microprocessor (MPU), central processing unit (CPU), image processing arithmetic logic unit (IPALU), and other logic circuit devices. In these active devices, higher speeds are being achieved at a prodigious rate in terms of calculating speed and signal processing speed, and the electrical signals propagated through the high-speed electronic circuits have become a major cause of inductive and high-frequency noise because of the rapid voltage and current changes associated therewith. Meanwhile, the trend toward lighter weight, thinner profile, and smaller size in electronic components and electronic equipment continues rapidly and unabatedly. In conjunction with that trend, the integration levels being achieved in semiconductor devices and the higher electronic component mounting densities being realized in printed wiring substrates are also remarkable. Accordingly, electronic devices and signal lines are integrated or mounted overly densely so as to become extremely close to each other. As remarked earlier, the situation is now such that high-frequency spurious radiation noise is easily induced in conjunction with the higher signal processing speeds being achieved.

Problems with spurious radiation from power supply lines going to active devices in such recent electronic integrated devices and wiring boards have been pointed out, against which such measures as the insertion of decoupling condensers or other concentrated constant components into the power lines have been implemented.

However, because the noise generated in higher speed implementations of electronic integrated devices and wiring boards contains harmonic components, signal paths exhibit a distributed constant behavior, and situations have arisen where measures against noise that presume conventional concentrated constant circuits are ineffective.

SUMMARY OF THE INVENTION

It is an object of the present invention to provide sheet-form high-frequency current suppression bodies that comprise magnetic material effective in countering spurious radiation from semiconductor devices and electronic circuits that operate at high speeds, as described above.

It is a special object of the present invention, moreover, is to provide a high-frequency current suppression body that comprises magnetic loss material exhibiting a large magnetic loss factor $\mu''$ wherewith effective measures against spurious radiation can be implemented with a magnetic body of smaller volume.

According to one aspect of the present invention, there is provided a high-frequency current suppression body that has a sheet shape comprising an adhesive layer or a pressure-sensitive adhesive layer on at least one surface of a magnetic thin film.

According to another aspect of the present invention, there is provided a high-frequency current suppression method, with which the high-frequency current suppression body described below is deployed either in tight contact with or in close proximity to an electronic circuit. In the high-frequency current suppression body, the magnetic thin film substantially composed of a magnetic loss material having an M—X—Y composition, where M is at least one of Fe, Co, and Ni. Y is at least one of F, N, and O, and X is at least one element other than M or Y, the aforementioned magnetic loss material being a broadband magnetic loss material such that the maximum value $\mu''$max of the loss factor $\mu''$ which is the imaginary part in the complex permeability of the magnetic loss material noted above exists within a frequency range of 100 MHz to 10 GHz and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof; the size of the saturation magnetization of the aforementioned magnetic loss material is in a range that is from 60% to 35% of the saturation magnetization of a metal magnetic body consisting solely of the M component; and the magnetic loss material has a DC electric resistivity value larger than 500 $\mu\Omega\cdot$cm.

According to still another aspect of the present invention, there is provided a high-frequency current suppression body formation method is obtained with which a magnetic thin film formed on one surface of a peelable sheet-form substrate is placed on an object, and by applying a pressure from the substrate side thereof, the portion of the magnetic thin film where the pressure is applied is transferred onto that object.

BRIEF DESCRIPTION OF THE DRAWINGS

FIG. 12A is a graph of the transmission characteristic (S21) of sample 1 based on an embodiment of the present invention;

FIG. 12B is a graph of the transmission characteristic (S21) of a composite magnetic body sheet that is a comparative sample;

FIG. 13 is a diagram of an equivalent circuit for a magnetic body based on an embodiment of the present invention;

DESCRIPTION OF THE PREFERRED EMBODIMENTS

Figure 1:
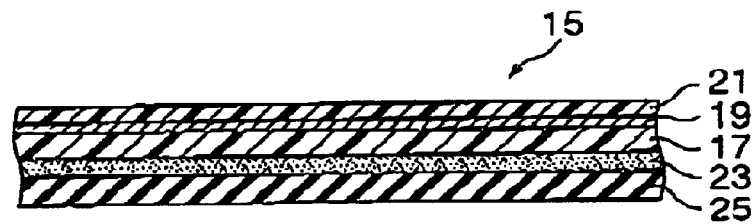
FIG. 1 is a front sectional view of a high-frequency current suppression body in a first embodiment of the present invention.

The history of the present invention will be described prior to describing embodiments of the present invention.

The inventors have previously invented a composite magnetic body exhibiting large magnetic loss at high frequencies, and discovered a method wherewith the generation of spurious radiation from the semiconductor devices and electronic circuits noted earlier, etc., is effectively suppressed by deploying the composite magnetic body in the vicinity of a spurious radiation source. It is known from recent research on the active mechanism of spurious radiation attenuation using such magnetic loss that such arises due to the impartation of equivalent resistance components to the electronic circuits constituting sources of spurious radiation. Here, the size of the equivalent resistance component is dependent on the size of the magnetic loss factor $\mu''$ of the magnetic body. More specifically, the size of the resistance component is equivalently inserted in an electronic circuit and is roughly proportional to $\mu''$ and the thickness of the magnetic body when the area of the magnetic body is constant. Accordingly, a larger $\mu''$ becomes necessary in order to obtain a desired spurious radiation attenuation with a smaller or thinner magnetic body.

For example, in order to effect measures against spurious radiation using a magnetic loss body in a miniscule region, such as in the interior of a semiconductor device mold, an extremely large value for the magnetic loss factor becomes necessary, whereupon magnetic bodies having significantly larger $\mu''$ than conventional magnetic loss materials have been sought.

The inventors, in the course of their research on soft magnetic materials using sputtering or vapor deposition methods, took note of the outstanding permeability of granular magnetic bodies wherein very fine magnetic metal particles are diffused uniformly in a non-magnetic body such as a ceramic, and conducted research on the microstructures of magnetic metal particles and the non-magnetic bodies surrounding them. As a result, the inventors discovered that outstanding magnetic loss characteristics are obtained in high-frequency regions when the concentration of magnetic metal particles in a granular magnetic body is within a certain range. Much research has been done to date on granular magnetic bodies having M—X—Y compositions, where M is a magnetic metal element, Y is either O, N, or F, and X is an element other than M or Y, and it is known that these are low-loss and exhibit large saturation magnetization. In these M—X—Y granular magnetic bodies, the size of the saturation magnetization is dependent on the volume ratio accounted for by the M component. Therefore, the ratio of the M component must be made high to obtain large saturation magnetization. For that reason, the ratio of the M component in an M—X—Y granular magnetic body for an ordinary application, such as use as a magnet core in a high-frequency inductor device or transformer or the like, has been limited to a range wherewith a saturation magnetization of roughly 80% or greater can be realized for the saturation magnetization of the bulk metal magnetic body consisting exclusively of the M component.

The inventors studied the ratio of the M component in granular magnetic bodies having the M—X—Y composition, where M is a magnetic metal element, Y is either O, N, or F, and X is an element other than M or Y, across a wide range, and discovered, as a result, that, with every composition system, large magnetic loss is exhibited in high-frequency regions when the magnetic metal M is present within a specific concentration range.

The highest region where the M component exhibits a saturation magnetization of 80% or greater relative to the saturation magnetization of a bulk metal magnetic body consisting exclusively of the M component is the M—X—Y granular magnetic body region of low loss at high saturation magnetization that has been widely researched for some time. Materials in this region are used in high-frequency micromagnetic devices, such as the high-frequency inductors mentioned above, because the values of the real-part permeability ($\mu'$) and the saturation magnetization are both large, but the ratio accounted for by the X—Y component that affects electrical resistance is small, wherefore electric resistivity is also small. For that reason, when the film thickness becomes thin, the permeability at high frequencies deteriorates in conjunction with the development of eddy current loss in the high-frequency region, wherefore these materials are unsuitable for use in comparatively thick magnetic films such as are used to suppress noise. In the region for the M component ratio exhibiting a saturation magnetization of 80% or less but 60% or more of the saturation magnetization of a bulk metal magnetic body consisting of only the M component, the electric resistivity is comparatively large at roughly 100 $\mu\Omega$·cm or greater. Therefore, even if the thickness of the material is on the order of several $\mu$m, the loss due to eddy currents is small, and almost all of the magnetic loss will be due to natural resonance. For that reason, the frequency dispersion width for the magnetic loss factor $\mu''$ will become narrow, wherefore such materials are suitable for anti-noise measures, i.e. high-frequency current suppression, in narrow-band frequency ranges. In the region for the M component ratio exhibiting a saturation magnetization that is 60% or less but 35% or greater of the saturation magnetization of a bulk metal magnetic body consisting solely of the M component, the electric resistivity will be even larger, at roughly 500 $\mu\Omega$·cm or greater, so the loss due to eddy currents will be extremely small, and, because the magnetic interaction between M component becomes small, spin thermal disturbance becomes large, and quivering develops in the frequency where natural resonance occurs. As a consequence, the magnetic loss factor $\mu''$ will come to exhibit a large value across a broad range. Accordingly, this composition region is suitable for wide-band high-frequency current suppression.

In regions where the M component ratio is even smaller than in the region of the present invention, on the other hand, super-normal magnetism will occur because the magnetic interaction between M components will hardly appear at all.

When a magnetic loss material is deployed immediately adjacent to an electronic circuit and high-frequency current is to be suppressed, the material design standard is given by the product of the magnetic loss factor $\mu''$ and the thickness δ of the magnetic loss material, that is, $\mu'' \cdot \delta$, and, in order to effectively suppress the high-frequency current at a frequency of several hundreds of MHz, the rough requirement will be $\mu'' \cdot \delta \geq 1000$ ($\mu$m). Accordingly, with a magnetic loss material exhibiting $\mu''=1000$, a thickness of 1 $\mu$m or greater becomes necessary, whereupon a material of low electrical resistance susceptible to eddy current loss is not suitable, but what is suitable is a composition wherewith the electric resistivity becomes 100 $\mu\Omega$cm or greater, that is, in the composition system of the present invention, the M component ratio is in a region where a saturation magnetization is exhibited that is 80% or lower than the saturation magnetization of a bulk metal magnetic body consisting solely of the M component and super-normal magnetism is not manifest, that is, a region exhibiting a saturation magnetization that is 35% or greater relative to the saturation magnetization of the bulk metal magnetic body consisting solely of the M component.

The inventors studied configurations wherewith, when applying such magnetic materials, it is possible to deploy them more easily and simply at the desired site, and thus arrived at the present invention.

Embodiments of the present invention are now described.

Referring to FIG. 1, a high-frequency current suppression body 15 has a granular magnetic thin film 19 consisting of $Fe_\alpha A_\beta O_\gamma$ formed on one surface or either a synthetic resin sheet or film substrate 17 by sputtering. On top of the granular magnetic thin film 19, a synthetic resin coating 21 is provided for peeling away and reinforcing the granular magnetic thin film. On the other surface of the substrate 17, meanwhile, a bonding adhesive or pressure-sensitive adhesive layer 23 consisting of rubber of a synthetic resin or the like and, formed thereon a peekaway sheet or removal sheet 25 are respectively provided. Here, the synthetic resin sheet or film substrate 17 may consist of any synthetic resin such as polyethylene terephthalate (PET), polyester ether ketone (PEEK), or polyimide, etc., so long as it is not deformed during sputtering processing or vapor deposition. For the bonding adhesive used for the bonding adhesive or pressure-sensitive adhesive layer 23, a solvent system or emulsion system resin, such as an acrylic acid ester, polyvinyl ether, polyvinyl acetate, polystyrene, or polyvinyl butyral resin can be used. For the tacky adhesive, those same resins to which a tackifier containing rosin or a derivative thereof, terpene resin or other terpene derivative, and a cyclopentadiene, styrene, phenol, xylene, or coumarone-indene resin, or a silicone, polyurethane, fluorine, or acrylic rubber may be used, with that wherein fire-retardant, insulative, flexible silicone rubber is used being particularly preferable, but any bonding adhesive or tacky adhesive whatever can be used which has sufficient adhesive strength not to peel away from the synthetic resin sheet or film substrate configuring the substrate 17.

For the peel-away sheet 25, either a surface-treated paper or resin or the like can be used so long as it can be easily peeled away from the adhesive surface. And for the synthetic resin coating 28, anything can be used so long as it forms a comparatively elastic synthetic resin layer when applied and dried. Alternatively, a thermoplastic rosin sheet may be pressed on under heat.

Figure 2:
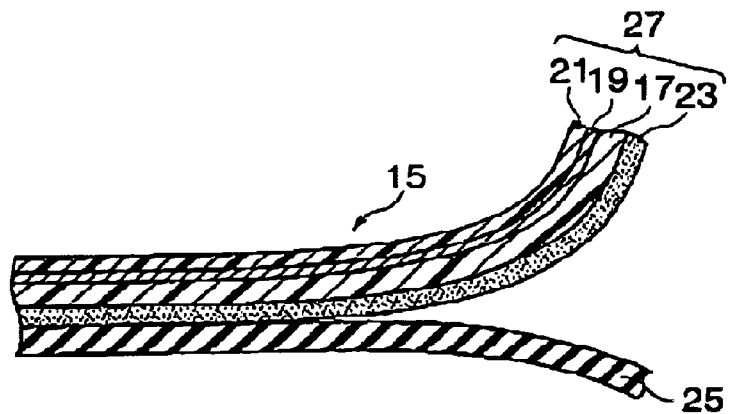
FIG. 2 is a diagram that helps describe the method of using the high-frequency current suppression body diagrammed in FIG. 1.
Figure 3:
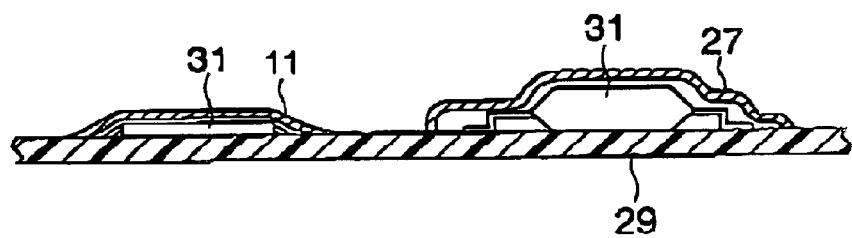
FIG. 3 is a diagram that helps describe the method of using the high-frequency current suppression body diagrammed in FIG. 1.

Referring to FIGS. 2 and 3, the peel-away sheet 25 is formed on one surface side of the high-frequency current suppression body 15 having a predetermined size. After the peel-away sheet 25 is peeled away, the high-frequency current suppression body 15 is adhesively applied at the desired site.

In the example diagrammed in FIG. 3, a high-frequency current suppression body 27 is applied so as to cover the entire surface of mounted components 31 such as ICs or LSIs that have been mounted on a substrate 29.

The high-frequency current suppression body 27 can also be applied to strip lines or jumper lines (not shown).

Thus, by applying the high-frequency current suppression body 15, it is possible to suppress spurious electromagnetic radiation that is a source of noise and to suppress high-frequency noise from the outside.

In the first embodiment noted above, what is used for the granular magnetic thin film 19 is represented by $Fe_\alpha$—$Al_\beta$—$O_\gamma$, but, in the present invention, it is sufficient to use a magnetic body the composition whereof is expressed by the general formula M—X—Y, and the present invention is not limited to or by the first embodiment described in the foregoing. Also, either one or both of the substrate 17 or surface protection layer 25 may be omitted if it is easy to handle.

Figure 4:
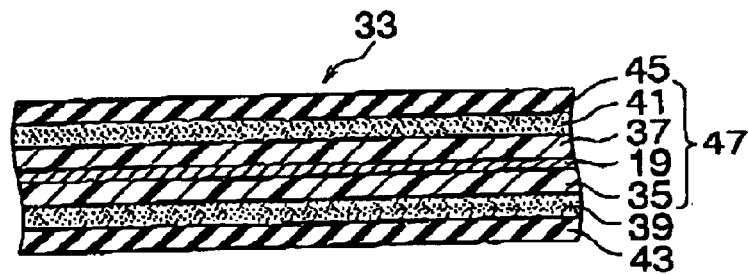
FIG. 4 is a front sectional view of a high-frequency current suppression body according to a second embodiment of the present invention.

Referring to FIG. 4, a high-frequency current suppression body 33 according to a second embodiment of the present invention has a granular magnetic thin film 19 consisting of $Fe_\alpha A_\beta O_\gamma$, formed by sputtering on one surface of a synthetic resin sheet or film substrate 35. On top of the granular magnetic thin film 19, a synthetic resin substrate 37 is formed by applying and drying a similar composition as described. Adhesive layers 39 and 41 are deployed on each surface. On the adhesive layers 39 and 41, peel-away sheets 43 and 45 are severally deployed. Accordingly, the high-frequency current suppression body 33 is farmed which has an adhesive layer on both sides thereof. For the synthetic resin layers 43 and 45 and the adhesive layers 39 and 41, the same materials as were used in the first embodiment can be used.

Figure 5:
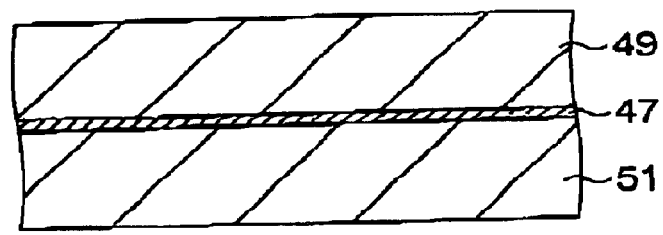
FIG. 5 is a diagram that helps describe the method of using the high-frequency current suppression body diagrammed in FIG. 4.

As diagrammed in FIG. 5, when this is used, the peel-away sheets of the high-frequency current suppression body 33 are peeled away and electronic components 49 and 51 are joined together. Thus, by deploying a high-frequency current suppression main body 47 between electronic components that each generate high-frequency noise, mutual interference and the like between electronic components can be prevented by suppressing spurious electromagnetic radiation, and high-frequency noise from the outside can also be suppressed.

In the second embodiment described in the foregoing, furthermore, $Fe_\alpha$—$Al_\beta$—$O_\gamma$, was used for the granular magnetic thin film 19, but, in the present invention, any magnetic body expressed by the general formula M—X—Y may be used, and the present invention is not limited to or by the second embodiment. Also, either one or both of the substrates 35 and 37 may be omitted if it is easy to handle.

Figure 6:
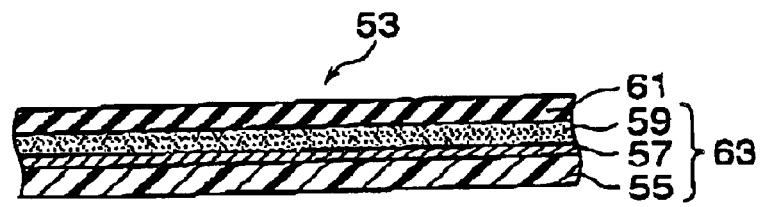
FIG. 6 is a front sectional view of a high-frequency current suppression body according to a third embodiment of the present invention.

Referring to FIG. 6, a high-frequency current suppression body 53 according to a third embodiment of the present invention has a peel-away substrate 55 made of a carrier tape or the like, a granular magnetic film 57 deployed on that peel-away substrate 55, and a pressure-sensitive adhesive layer 59 deployed on the granular magnetic film 57. A peel-away sheet 61 is provided to prevent tackiness. For the pressure-sensitive adhesive layer 59, substances like those exemplified in the first embodiment can be used.

Figure 7A:
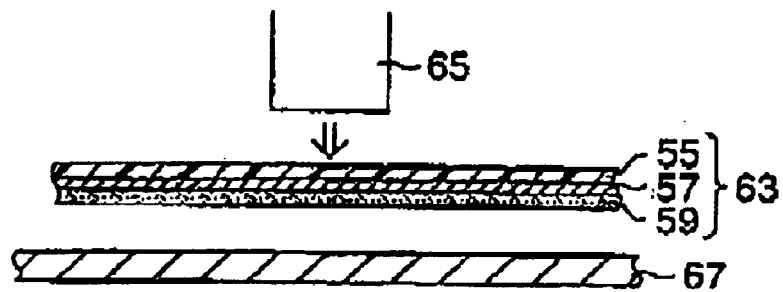
FIGS. 7A, 7B, and 7C are diagrams that help describe the method of using the high-frequency current suppression body diagrammed in FIG. 6.
Figure 7B:
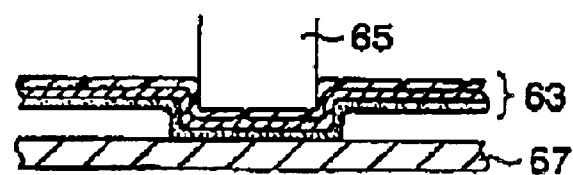
Figure 7C:
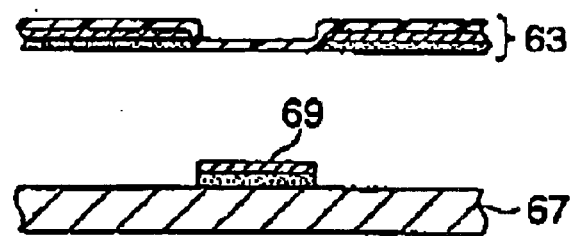

As diagrammed in FIG. 7A, when using the high-frequency current suppression body 53, the peel-away sheet 61 has been removed from the surface of the high-frequency current suppression body 53. Thereafter, the surface of the high-frequency current suppression body 53 is positioned so as to face the desired surface of a substrate 67. As diagrammed in FIG. 7B, pressure is applied with a punch 65 from the surface on the back side from the facing surface. Thereupon, as diagrammed in FIG. 7C, the adhesive layer 59 and the granular magnetic thin film 57 formed superimposed thereon separate together from the peel-away substrate 55, according to the shape of the pressing punch 65, and adhere to the substrate 67 as a high-frequency current suppression body film 69. Thus a high-frequency current suppression body of the desired shape can be formed at a desired site.

In the third embodiment of the present invention, moreover, the peel-away substrate 55 was used, but it is also permissible to provide the punch 65 with a heating mechanism, effect heating and fusion when applying pressure, solidifying the resulting fused resin, and adhesively applying the granular magnetic thin film, without providing the adhesive layer 59 and peel-away sheet 61.

This may be something having rubber or synthetic resin exhibiting tackiness between the peel-away substrate 55 and the granular magnetic thin film 57, in which case there is no need to provide the punch 57 with a heating mechanism.

Figure 8:
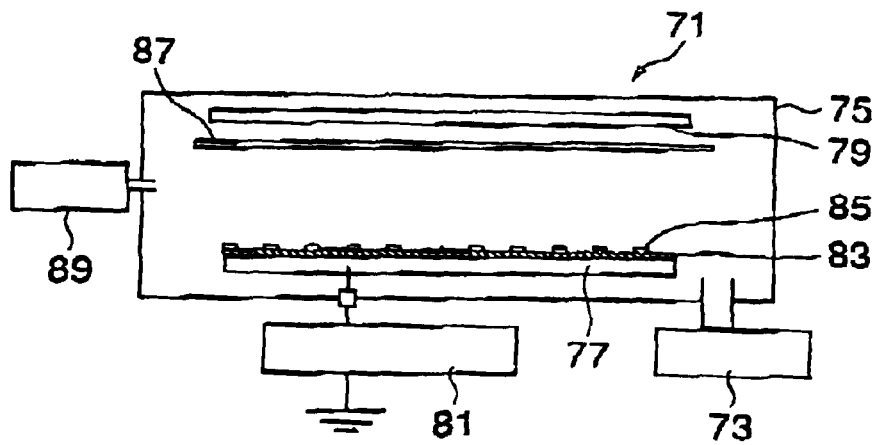
FIG. 8 is a simplified diagram of the configuration of an apparatus for forming a granular magnetic thin film.

The structure of the granular magnetic body M—X—Y used in the embodiments of the present invention is now described, together with a specific example of a manufacturing method therefor, making reference to FIG. 8.

Referring to FIG. 8, a sputtering apparatus 71 has a target sample table platform 77 and board 79 inside a vacuum chamber 75 capable of having the air therein exhausted by a vacuum pump 73. The target sample platform 77 is connected to an RF power supply 81 from the outside. On the target sample platform 77 are a target 83 and chips 85 placed thereon. Between the target sample platform 77 and the board 79 is deployed a shutter 87 so as to cover the board 79. Symbol 89 designates a gas supply unit for supplying gas to the inside of the chamber.

A manufacturing example will be next described.

SAMPLE 1

Using the apparatus diagrammed in FIG. 8, a granular magnetic thin film was fabricated on the glass board 79 by sputtering, under the conditions noted below in Table 1. The sputtered film obtained thereby was subjected to a heat treatment in a vacuum magnetic field for 2 hours at 300° C. to yield sample 1.

When this sample 1 was subjected to fluoroscopic x-ray analysis, the composition of the film was found to be $Fe_{72}Al_{11}O_{17}$. The film thickness in sample 1 was 2.0 $\mu$m, the DC resistivity was 530 $\mu\Omega$·cm, Hk was 18 Oe (1422 A/m), Ms was 16800 Gauss (1.68 T), and the relative bandwidth bwr was 148%. The relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The value of the ratio between the saturation magnetization of sample 1 and the saturation magnetization of a metal magnetic body consisting solely of the M component was 72.2%.

TABLE 1

| Vacuum degree before deposition | $<1 \times 10^{-6}$ Torr (=$1.33 \times 10^{-4}$ Pa) |
|---|---|
| Atmosphere upon deposition | Ar |
| Power Supply | RF |
| Target | Fe (Diameter $\phi$: 100 mm) + $Al_2O_3$ chip (120 pieces) (Chip size: 5 mm × 5 mm × 2 mm t) |

In order to verify the magnetic loss characteristics of the sample, the $\mu$-f characteristic was investigated. Measuring the $\mu$-f characteristic is done by inserting the sample into a detection coil fashioned in a ribbon shape, and measuring the impedance while applying a bias magnetic field. Thus the frequency characteristics of the magnetic loss factor $\mu''$ are obtained.

COMPARATIVE SAMPLE 1

Comparative sample 1 was obtained by the same method and under the same conditions as sample 1 except in that the number of $Al_2O_3$ chips was made 90.

When the comparative sample 1 so obtained was subjected to fluoroscopic x-ray analysis, the composition of the film was found to be $Fe_{86}Al_6O_8$. The film thickness was 1.2 $\mu$m, the DC resistivity in comparative sample 1 was 74 $\mu\Omega$·cm, the anisotropic magnetic field was 22 Oe (1738 A/m), and Ms was 18800 Gauss (1.88 T). The ratio between the saturation magnetization of comparative sample 1 and the saturation magnetization of a metal magnetic body consisting solely of the M component, that is, the value of $\{Ms(M—X—Y)/Ms(M)\} \times 100$, was 85.7%.

Figure 9:
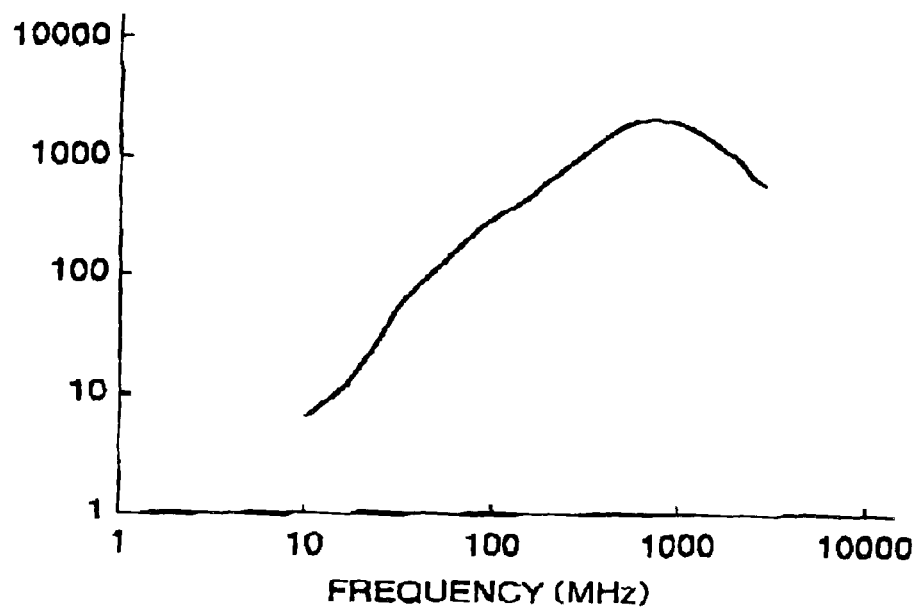
FIG. 9 is a graph of an example of the frequency dependence of the $\mu''$ of a sample 1 based on an embodiment of the present invention.

Referring to FIG. 9, in the $\mu''$-f characteristic for sample 1 of the present invention, the peak is very high, and the dispersion is sharp, with the resonant frequency high in the neighborhood of 700 MHz.

Figure 10:
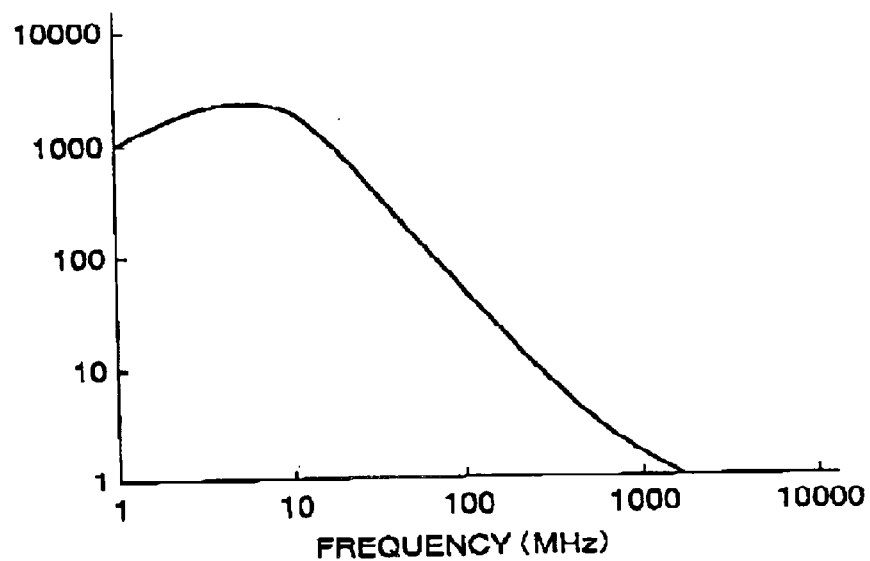
FIG. 10 is a graph of an example of the frequency dependence of $\mu''$ affecting a comparative sample 1.

Referring to FIG. 10, in the $\mu''$-f characteristic, comparative sample 1 exhibits a large $\mu''$, reflecting the fact that the saturation magnetization Ms is large. However, because the resistance value of this sample is low, eddy current losses are generated as the frequency rises. Thus it is evident that a deterioration in the permeability (magnetic loss characteristic) has developed from the low-frequency region, and that the permeability characteristics have become poor at high frequencies.

It will be seen from these results that the magnetic body in sample 1 of the present invention exhibits very high magnetic loss characteristics in high-frequency regions.

Next will be described tests done to verify noise suppression effectiveness using the sample(s) obtained with the embodiments of the present invention.

Figure 11:
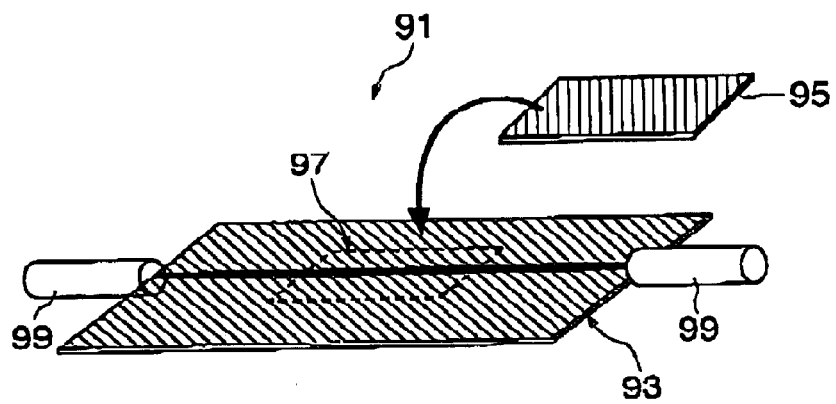
FIG. 11 is a diagonal view of a measurement system for observing the suppression effects of a high-frequency current suppression body consisting of magnetic loss material based on the present invention.

Using the measurement system diagrammed in FIG. 11 to verify noise suppression effectiveness, and using a high-frequency current suppression body comprising the granular magnetic thin film of sample 1 having the permeability characteristic diagrammed in FIGS. 4 and 5, formed in a square 20 mm on a side, with a film thickness of 2.0 $\mu$m, that was placed directly above a microstrip line having a line length of 75 mm and a characteristic impedance of 50 $\Omega$, and the transmission characteristics between 2 Ports were determined using a network analyzer (HP 8753D).

In Table 2, the permeability characteristics for the high-frequency current suppression body sheet of the granular magnetic thin film samples 1 are given together with the characteristics for a composite magnetic body sheet of the same area consisting of flat Sendust powder and a polymer used as a

TABLE 2

| | Permeability Characteristics | |
|---|---|---|
| | Granular Magnetic Thin Film | Composite Magnetic Sheet |
| $\mu''$/700 MHz | about 1800 | about 3.0 |
| bwr | 148 | 196 | comparative sample. The $\mu''$ of the granular magnetic thin film sample 1 exhibits a dispersion in the sub-microwave band, with a size $\mu''$max=approximately 1800 in the vicinity of 700 MHz. This is some 600 times larger than the $\mu''$ of the comparative sample that exhibits $\mu''$ dispersion in the same band. Furthermore, the relative bandwidth is small compared to that of the comparative sample, from which it is seen that this is a narrow band. When high-frequency currents are suppressed by deploying a magnetic loss material immediately next to a noise transmission path and imparting an equivalent resistance component to the transmission path, it is believed that the level of suppression effect will be roughly proportional to the product of the size of $\mu''$ and the thickness of the magnetic body ($\mu''\cdot\delta$), wherefore, when comparing suppression effects, a composite magnetic body sheet wherein $\delta$=1.0 mm at $\mu''\approx 3$ such that the value of is $\mu''\cdot\delta$ will be on the same order was used as the comparative example.

More specifically, as diagrammed in FIG. 11, the high-frequency current suppression body sheet was deployed directly over the conductor of a microstrip line 95 as indicated by the broken line 97, and the changes in the transmission characteristic $S_{21}$ were determined. In FIG. 11, the symbol 99 designates a coaxial line.

In FIGS. 12A and 12B, the $S_{21}$ characteristics are plotted when deploying, respectively, the high-frequency current suppression body sheet of the granular magnetic thin film sample 1 and the composite magnetic body sheet. With the deployment of the granular magnetic thin film sample 1, the $S_{21}$ characteristic decreases at and above 100 MHz, then increases after exhibiting an extremely small value of –10 dB near 2 HGz. In the case of the composite magnetic body sheet, on the other hand, the $S_{21}$ characteristic, simply decreases from several hundreds of MHz on, exhibiting approximately –10 dB at 3 GHz. These results indicate both that the $S_{21}$ transmission characteristic is dependent on the $\mu''$ dispersion of the magnetic body, and that the level of the suppression effect is dependent on the $\mu''\cdot\delta$ product. Thereupon, the magnetic body was assumed to be a dimension $\lambda$ distribution constant line, such as all diagrammed in FIG. 13, and, after finding the equivalent circuit constant per unit length ($\Delta\lambda$) from the transmission characteristics $S_{11}$ and $S_{21}$, the equivalent circuit constant was calculated to be converted to the sample dimension ($\lambda$). As in this study, when a magnetic body is placed above a microstrip line. The changes in transmission characteristic are mainly due to the equivalent resistance component that is added in series, the equivalent resistance R was found, and the frequency dependency thereof was investigated.

Figure 14A:
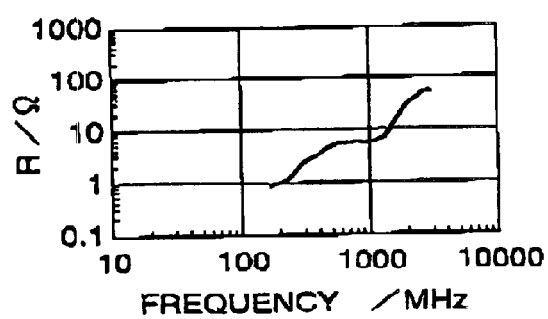
FIG. 14A is a graph of R values calculated from the transmission characteristic of sample 1, according to an embodiment of the present invention.
Figure 14B:
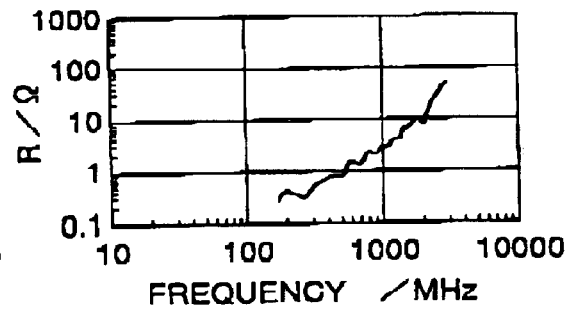
FIG. 14B is a graph of R values calculated from the transmission characteristic of a composite magnetic body sheet that is a comparative sample.

Referring to FIGS. 14A and 14B, in the frequency variation in the equivalent resistance R in the present invention and in the composite magnetic body sheet that is the comparative sample, in both cases, the equivalent resistance R simply increases in the sub-microwave band, becoming several tens of $\Omega$ at 3 GHz. The frequency dependency of the equivalent resistance R appears to have a different trend from that of the frequency dispersion of $\mu''$ that becomes extremely large in the vicinity of 1 GHz, in both cases, but this is thought to be a result of reflecting the fact that, in addition to the $\mu''\cdot\delta$ product noted earlier, the ratio of the sample dimensions to the wavelength increases simply.

In the embodiments of the present invention, manufacturing examples are indicated that are based on sputtering or vacuum vapor deposition procedures, but such manufacturing methods as ion beam vapor deposition or gas deposition may also be used, and there is no limit on the method so long as it is one wherewith the magnetic loss material of the present invention can be uniformly effected.

In the embodiments of the present invention, moreover, this is an as-deposition film, but the performance and characteristics can be altered after film fabrication by performing a heat treatment in a vacuum magnetic field.

Based on the foregoing, it is evident that the samples of the present invention that exhibit $\mu''$ dispersion in the sub-microwave band exhibit a high-frequency current suppression effect equivalent to that of a composite magnetic body sheet having a thickness that is approximately 500 times greater, and that such are promising as materials used to minimize EMI, between electronic components comprising semiconductor integrated devices and the like that operate with a high-speed clock running near 1 GHz and electronic components mutually susceptible to interference, and in electronic components and circuit devices and the like that use high frequencies.

The granular magnetic films described in the foregoing relate only to $Fe_\alpha Al_\beta O_\gamma$, but it is evident that the granular magnetic thin film of the present invention can elicit the same effects even it, instead thereof, the components of the magnetic body with the general formula M—X—Y are such that M is Ni, Fe, or Co, the X component is C, B, Si, Al, Mg, Ti, Zn, Hf, Sr, Nb, Ta, or a rare earth, or, alternatively, a mixture of those, and the Y component is F, N, or O, or, alternatively, a mixture of those.

The film forming method used in the embodiments described in the foregoing was sputtering, but other methods such as vapor deposition or the like can also be employed. In addition, such manufacturing methods as ion beam deposition or gas deposition may also be used. There is no limitation on the method so long as it is one wherewith the granular magnetic thin film of the present invention can be realized uniformly.

In the embodiments of the present invention, furthermore, description is given for high-frequency current suppression bodies comprising a synthetic resin substrate or an adhesive layer or pressure-sensitive adhesive layer comprising a synthetic resin, but it is permissible to form the granular magnetic film directly on the site f use, and form a protective film or the like on top of that, and the present invention is not limited to or by the method of adhesion or affixing.

Based on the present invention, as described in the foregoing, it is possible to provide a high-frequency current suppression body having a magnetic thin film exhibiting outstanding high-frequency magnetic loss characteristics extremely effective in eliminating interference caused by electromagnetic noise or spurious electromagnetic radiation from circuit boards using electronic components and/or high frequencies.

What is claimed is:

1. A high-frequency current suppression body having a sheet shape and comprising a magnetic thin film, an adhesive layer or pressure-sensitive adhesive layer and optionally a substrate, the adhesive or pressure-sensitive adhesive being deposited on one surface of the thin film, or the substrate disposed between the adhesive or pressure sensitive adhesive layer and the thin film, wherein said magnetic thin film consists essentially of a magnetic loss material having an M—X—Y composition, where M is at least one of Fe, Co, and Ni, X is at least one element other than M or Y, and Y is at least one of F, N, and O, said M component in said magnetic loss material existing in a granular form dispersed in the matrix of said X—Y compound, said magnetic loss material being is a magnetic loss material such that the maximum value m"max of loss factor $\mu''$ exists within a frequency range of 100 MHz to 10 GHz, said loss factor $\mu''$ being an imaginary part in complex permeability of said magnetic loss material, said X component in said magnetic loss material consisting of at least one of C, B, Si, Al, Mg, Ti, Zn, Hf, Sr, Nb, Ta, and rare earth elements.

2. The high-frequency current suppression body according to claim 1, further comprising a film or sheet-form substrate composed of a synthetic resin, wherein said magnetic thin film is provided on one surface of the substrate composed of a synthetic resin.

3. The high-frequency current suppression body according to claim 2, wherein said adhesive layer or pressure-sensitive adhesive layer is provided on one surface of said magnetic thin film with said substrate interposed therebetween.

4. The high-frequency current suppression body according to claim 1, wherein said magnetic thin film is provided on one surface of a film or sheet-form substrate so that said magnetic thin film can be peeled away from said substrate.

5. The high-frequency current suppression body according to claim 1, having a relative bandwidth bwr not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

6. The high-frequency current suppression body according to claim 5, wherein said magnetic loss material has a thickness within a range of 0.3 mm to 20 mm.

7. The high-frequency current suppression body according to claim 5, wherein size of saturation magnetization of said magnetic loss material is in a range of 80% to 60% of saturation magnetization of metal magnetic body consisting solely of M component.

8. The high-frequency current suppression body according to claim 5, wherein said magnetic loss material exhibits a DC electric resistivity in a range of 100 $\mu\Omega\cdot$cm to 700 $\mu\Omega\cdot$cm.

9. The high-frequency current suppression body according to claim 5, wherein mean particle diameter of particle M component having said granular form is in a range of 1 nm to 40 nm.

10. The high-frequency current suppression body according to claim 5, wherein said magnetic loss material exhibits an isotropic magnetic field Hk of 600 Oe ($4.74 \times 10^4$ A/m) or less.

11. The high-frequency current suppression body according to claim 5, wherein said magnetic loss material has a composition represented by general formula $Fe_\alpha$—$Al_\beta$—$O_\gamma$.

12. The high-frequency current suppression body according to claim 5, wherein said magnetic loss material has a composition represented by general formula $Fe_\alpha$—$Si_\beta$—$O_\gamma$.

13. The high-frequency current suppression body according to claim 5, wherein said magnetic loss film is a sputtered or vapor deposited thin-film.

14. The high-frequency current suppression body according to claim 1, having a relative bandwidth bwr not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

15. The high-frequency current suppression body according to claim 14, wherein said magnetic loss material has a size of saturation magnetization within a range of 60% to 35% of saturation magnetization of metal magnetic body consisting solely of M component.

16. The high-frequency current suppression body according to claim 14, wherein said magnetic loss material exhibits a DC electric resistivity value larger than 500 $\mu\Omega\cdot$cm.

* * * * *

UNITED STATES PATENT AND TRADEMARK OFFICE
CERTIFICATE OF CORRECTION

PATENT NO. : 6,921,573 B2
APPLICATION NO. : 09/836711
DATED : June 26, 2005
INVENTOR(S) : S. Watanabe, K. Kamei and Y. Awakura It is certified that error appears in the above-identified patent and that said Letters Patent is hereby corrected as shown below:

Column 6, line 44, "farmed" should read --formed--.

Column 11, line 15, in claim 1, delete "being";

line 16, in claim 1, "m"max" should read --$\mu"_{max}$--; and line 45, in claim 6, "0.3 mm to 20 mm" should read --0.3 μm to 20 μm--.

Signed and Sealed this

Sixteenth Day of October, 2007

JON W. DUDAS
*Director of the United States Patent and Trademark Office*